United States Patent [19]
Bjerede

[11] 3,946,323
[45] Mar. 23, 1976

[54] DIGITAL CIRCUIT FOR GENERATING OUTPUT PULSES SYNCHRONIZED IN TIME TO ZERO CROSSINGS OF INCOMING WAVEFORMS

[75] Inventor: Bjorn E. Bjerede, San Diego, Calif.

[73] Assignee: General Dynamics Corporation, San Diego, Calif.

[22] Filed: July 25, 1974

[21] Appl. No.: 491,731

[52] U.S. Cl............. 328/63; 178/69.5 R; 307/269; 328/155
[51] Int. Cl.² ... H03K 1/17; H03B 3/04; H03K 5/13
[58] Field of Search ........ 307/269, 208; 328/63, 72, 328/155, 179; 178/69.5 R

[56] References Cited
UNITED STATES PATENTS 2,976,517   3/1961   Fuller et al. .................. 328/120
3,755,748   8/1973   Carlow et al. .................. 307/269

*Primary Examiner*—Stanley D. Miller, Jr.
*Attorney, Agent, or Firm*—Brown & Martin

[57] ABSTRACT

A digital phase locked loop circuit for use in synchronizing output timing pulses with the positive going zero-crossings of an input data signal by quantitizing the input analog data signal as digital information, storing the digital information at given times by timing pulses, pre-programming a counter with a count corresponding to the quantitized digital information stored, and advancing or lagging an updated timing pulse in accordance with the timed count of the program counter which count is synchronized with the zero-crossings of the input data signal, whereby the updated timing pulses move to synchronism with the zero-crossings of the input data signal.

10 Claims, 5 Drawing Figures

DIGITAL CIRCUIT FOR GENERATING OUTPUT PULSES SYNCHRONIZED IN TIME TO ZERO CROSSINGS OF INCOMING WAVEFORMS

BACKGROUND OF THE INVENTION

In electronic, microwave oriented navigation systems, such as a TACAN navigation system, the bearing from the TACAN navigation unit to a cooperating ground beacon is determined from the position-going-zero-crossings of the amplitude modulation components that are contained in the beacon pulses. In the operation of such systems, during a given time period there are usually a given number of positive-going-zero-crossings. The bearings are computed by the navigation system from the relationship of the multiple positive-going-zero-crossings that is the closest to the time period positive-zero-crossing.

In conventional TACAN navigational sets, the desired zero-crossings are determined using analog or hybrid analog/digital phase locked loop circuits. These systems, however, often suffer from problems of instability and drift commonly associated with analog phase locked loop components. Thus it is advantageous to have a new and improved digital phase locked loop circuit that uses an all digital approach and that substantially eliminates the problems of instability and drift and is capable of providing improved sensitivity through adaptive bandwidth switching and that reduces cost as the digital processing circuitry used can also be time shared to perform other necessary functions in the navigation system.

SUMMARY OF THE INVENTION

In an examplary embodiment, the input data signal is fed to an A to D converter. The A to D converter continuously quantitizes to digital information the analog magnitude of the input data signal. A storage means samples and holds a quantity of the digital information at time sequences set by timing pulses. This quantum of digital information is used to provide a pre-programmed count in a counter means. The counter means initiates a count in synchronism with the zero-crossings of the input data signal to count out the preprogrammed count. This provides a magnitude oriented time advance or delay in the timing of the carry pulse from the counter. A pulse circuit processes the carry pulse and provides updated timing pulses that are fed to the storage means. The updated timing pulses advances or delays in time the sampling by the storage means and thereby moves the system and the updated timing pulses to synchronism with the zero-crossings of the input data signal.

The circuit includes adder circuits that function in coordination with the storage means circuits to detect whether the digital quantum stored is representative of the timing being in advance of or lagging the positive-going-zero-crossing of the input data signal. This is accomplished by storing a first output of the A to D converter as timed by a first timing pulse in correlation with the positive-going-zero-crossing of the input data signal, and the storing of an inverted output of the A to D converter in response to a second timing pulse in correlation with the negative-going-zero-crossing of the input data signal. The adder circuits and storage means detect whether the sum of the two digital signals is plus or minus. A minus indicates that the timing pulses lead zero-cross-over and a plus indicates that the timing pulses lag zero-cross-over.

The variable delay of the counter means is determined by an accurate clock signal to the counter. The storage means inserts a preprogrammed count into the counter that in cooperation with the accurate clock signal, provides a count that is equal in time with a half cycle of the input data signal. The given count inserted into the counter that is proportional to the digital quantum in the storage means, is added to or subtracted from the constant pre-programmed count fed to the program counter, thus adjusting lag or lead counts to the positive-zero-crossover of the input data signal. The output of the program counter is divided by a divider circuit to provide two timing pulses for each cycle of the input data signal, or a single timing pulse for each half cycle of the input data signal.

In the adder and storage means portion of the circuit, additional adders and storage latch circuits are employed to adjust the digital quantum of the digital information from the A to D circuit to provide damping to the system to reduce the problems of velocity error in the input data signal that can result in phase changes of the timing pulses due to changes in the frequency of the input signal.

It is therefore an object of this invention to provide a new and improved digital phase lock loop circuit that has particular application in electronic microwave navigation systems such as TACAN navigation systems.

Other objects and many advantages of this invention will be more apparent upon a reading of the following detailed description and an examination of the drawings wherein like reference numerals designate like parts throughout and in which.

Figure 1:
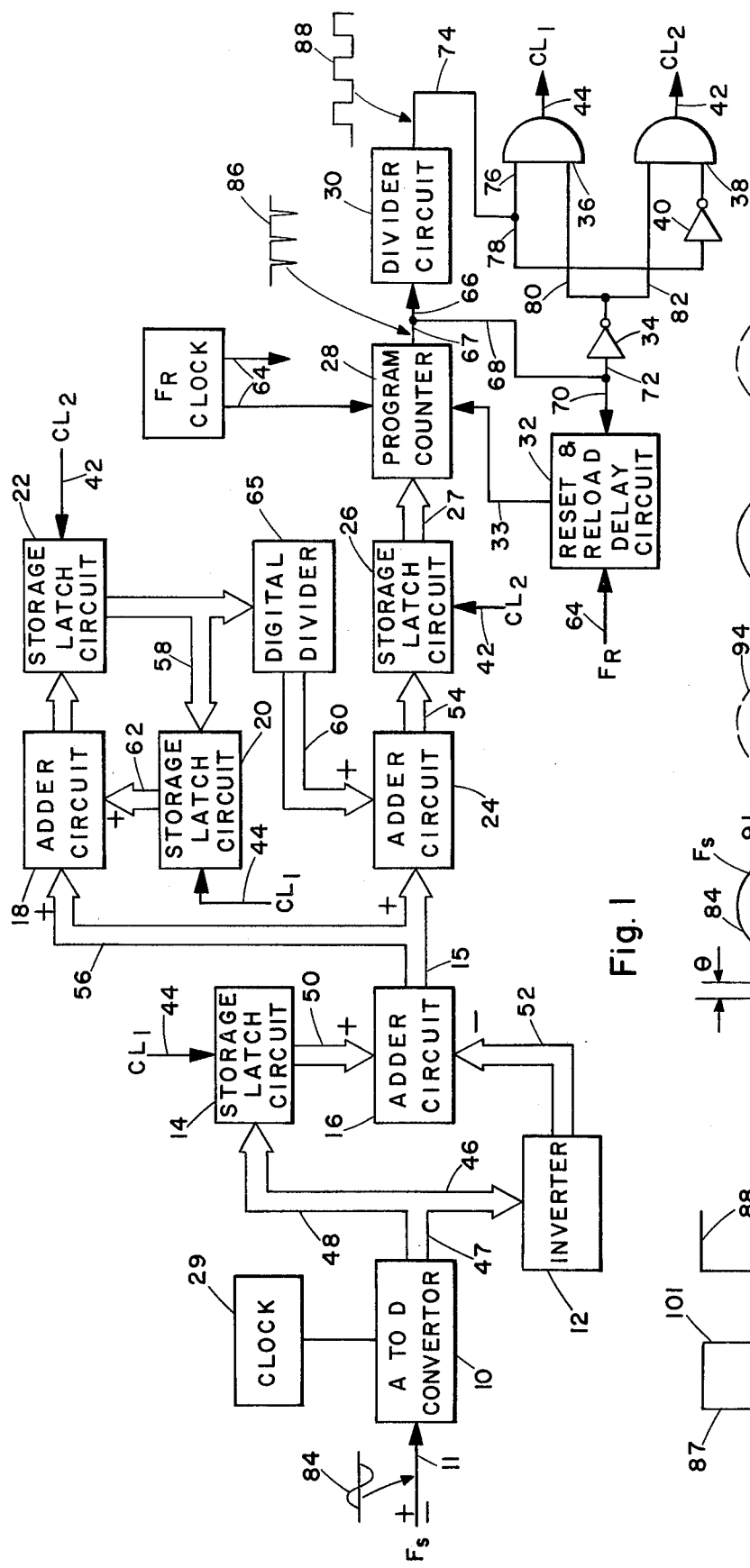
FIG. 1 is a block diagram of an embodiment of the circuit of the invention.
Figure 3:
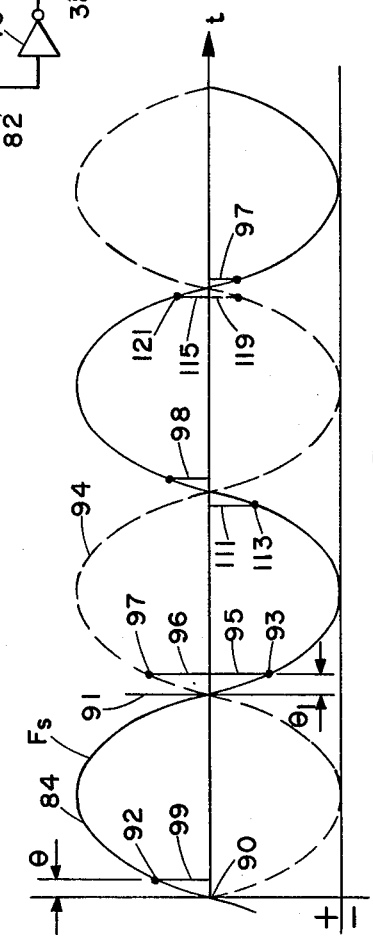
FIG. 3 is a diagram of the input sinewave signal of interest and the initial phase error of the timing pulses.

Referring now to FIGS. 1 and 3, an amplitude modulation component, as for example a sinewave input data signal 84 having a frequency Fs, is fed through input line 11 to a known analog to digital converter 10. The analog to digital (A to D) converter 10 continuously quantitizes to digital information the analog magnitude of the input data signal 84 and generates an eight bit digital output through lines 47 corresponding to the magnitude of the input signal 84. The input data signal 84 can be the information signal received by an antenna in a navigation system, such as a TACAN navigation system. This antenna received signal is filtered, amplified and then amplitude detected, providing a signal having a voltage amplitude that reflects the pulse amplitude of the antenna received signal. For purposes of this illustration it may be assumed that frequency Fs is 135 Hz. The A to D converter 10 can be clocked by a clock signal of, for example, 2700 Hz that is supplied by clock 29. In actual operation of the embodiment, the input data signal 84 comprises a series of step voltage level changes. Each step change initiates an A to D output from A to D converter 10, which internally times the A to D converter. In this description there would thus be twenty steps for each cycle.

The digital output in lines 47 is supplied through lines 48 to storage latch circuit 14 and through lines 46 to the inverter 12. Storage latch circuit 14 is a known storage element circuit for storing each bit of the eight bit input and may comprise, for example, eight flip-flop circuits. An example of the known storage latch circuit is the type SN54100 8-bit bistable latch circuit that is made and sold by Texas Instruments, Inc. and presented in the Texas Instruments Bulletin No. DL–S 7211830, December, 1972, and in the Texas Instruments TTL Data Book for Design Engineers published by Texas Instruments, Inc. in 1973. The storage latch circuit 14 is gated by timing pulses through line 44 corresponding to the circuit output of timing pulses $CL_1$. Thus a sample of the eight bit signal information in lines 48 is stored at the timing set by the timing pulses $CL_1$. The stored output of the storage latch circuit 14 is continuously fed through output lines 50 to the digital adder circuit 16. An example of a known 8-bit digital adder circuit is two of the type SN54283 4-bit binary full adders with fast carry circuit that are made and sold by Texas Instruments, Inc. and presented in the Texas Instruments Bulletin No. DL-S 7211832, December 1972, and in the Texas Instruments TTL Data Book for Design Engineers published by Texas Instruments, Inc. in 1973. So the eight bit information in lines 50 correspond to that which is stored in storage latch circuit 14 and represents a plus output. Storage latch circuit 14 stores that particular digital input corresponding to the particular magnitude of the input data signal 84 supplied to A to D converter 10 at the time the latch storage device 14 is clocked by a timing pulse $CL_1$ through line 44. The output of the known inventer circuit 12, that represents the minus output is continuously fed through lines 52 to the adder circuit 16. An example of the known digital inverter circuit is two of the type SN5404 hex inverters comprising positive NAND gates and inverters with totempole outputs that are made and sold by Texas Instruments, Inc. and are listed in the Texas Instruments TTL Data Book for Design Engineers published by Texas Instruments in 1973. This output is constantly changing with the input data signal 84. Adder circuit 16 continously adds the stored eight bit information in lines 50 with the inverted eight bit digital information in lines 52. Since the output in lines 50 is set and the output in lines 52 is changing, the output of adder circuit 16 is either plus, when the output in line 50 is larger, or minus when the output in line 52 is larger. The terms plus the minus are used to designate which output is larger. Adder circuit 16 is a known parallel adder that may comprise two known integrated circuits in which the output carrier is inverted and used as the ninth bit to indicate the plus or minus condition of the digital output. So adder circuit 16 provides a nine bit digital output wherein the ninth bit is a 0 or 1 when the digital output is plus or minus. The inverted digital information to the adder circuit 16 is used to obtain from the adder 16 a 2s-complement binary output to provide an off-set binary count in the program counter 28. The conventional 2s-complement binary code is described and explained on Page 10 of the publication "Minicomputers for Engineers and Scientists" by Granino A. Korn, Ph.D., that is published by McGraw-Hill Book Company in 1973.

It may be understood that the function of the circuit is to provide synthesized timing pulses $CL_1$ through line 44 and timing pulses $CL_2$ through line 42 that correspond in time to the positive and negative going-zero-crossings of the input sinewave 84. So it is desired that the timing pulse $CL_1$ in line 44 corresponds in time with point 90 of the input data signal 84, see FIG. 3, and that the timing pulse $CL_2$ in line 42 corresponds in time with line 91 of the input data signal 84. For purposes of this illustration, it may be assumed that initially the timing pulse $CL_1$ occurs at a phase lag point 92 on wave form 84 and the timing pulse $CL_2$ occurs at the phase lag point 93. It is desired to determine what the phase lag is between point 90 and line 99 and line 91 and line 95, and to advance the timing or phase of the timing pulses $CL_1$ and $CL_2$ to close the gap or phase lag $\theta$ and $\theta_1$ to zero. The phase may also be leading as at points 113 and 121.

In the phase lag condition, the timing pulse $CL_1$ through line 44 to storage latch circuit 14 causes storage latch circuit 14 to store the digital output of the plus magnitude at point 92 of wave form 84. At this instant, the inverted digital output in lines 52 to adder circuit 16 is of the same magnitude but inverted or of a minus condition. So the two digital signals balance out. However since the output digital information in lines 52 correspond to the dotted waveform 94 of FIG. 3, the digital sum output in lines 15 becomes minus during the major portion of the positive half of wave form 84 and becomes plus during the negative going half of wave form 84.

The nine bit digital information is then fed through adder circuit 24 to the storage means or storage latch circuit 26. The circuit controlling the adder 24 will be described in greater detail hereinafter. For purposes of explanation at this point, it will be assumed that the nine bit information passes through lines 15 and 54 directly to the storage latch circuit 26. Storage latch circuit 26 stores the digital information previously stored in storage latch circuit 14 at timing pulse $CL_1$ that is added with the varying inverted digital information in lines 52 at the particular time of the timing pulse $CL_2$ in line 42. Referring to FIG. 3, this ccorresponds to adding the digital magnitude of the wave form 84 at point 92, corresponding to line 99, and the digital inverted output corresponding to line 96 at point 97, which is the compliment of line 95 at point 93. Assuming that the wave form 84 is a perfect sinewave, then the storage circuit 26 stores a plus digital number corresponding to a phase lag condition that is double the magnitude of the line 99 or line 96 or the sum of lines 99 and 96. When the phase is leading then timing pulse $CL_1$ will clock storage latch circuit 14, at for example, point 113 and timing pulse $CL_2$ will clock storage latch circuit 26 at point 121. The storage latch circuit may comprise two of the known SN54100 circuits made and sold by Texas Instruments, Inc. It will be observed that in this phase lead condition, the storage latch circuit 14 stores a minus digital number corresponding to line 111 and at timing pulse $CL_2$, storage latch circuit 26 stores the sum of inverter 12, that corresponds to the magnitude of line 115 inverted or dotted line 119 at point 121. So storage latch circuit 26 stores a double minus signal in a phase lead condition. This effectively removes the probelm of cancelling by the inverted output from inverter 12 in lines 52 with the digital information in lines 50, but provides the plus or minus information. Latch storage circuit 26 feeds this digital information through lines 27 to program counter 28. Program counter 28 is a known synchronous 4-bit binary up/-down counter with preset inputs, such as three of the S54193 circuits made and sold by Signetics.

Figure 4:
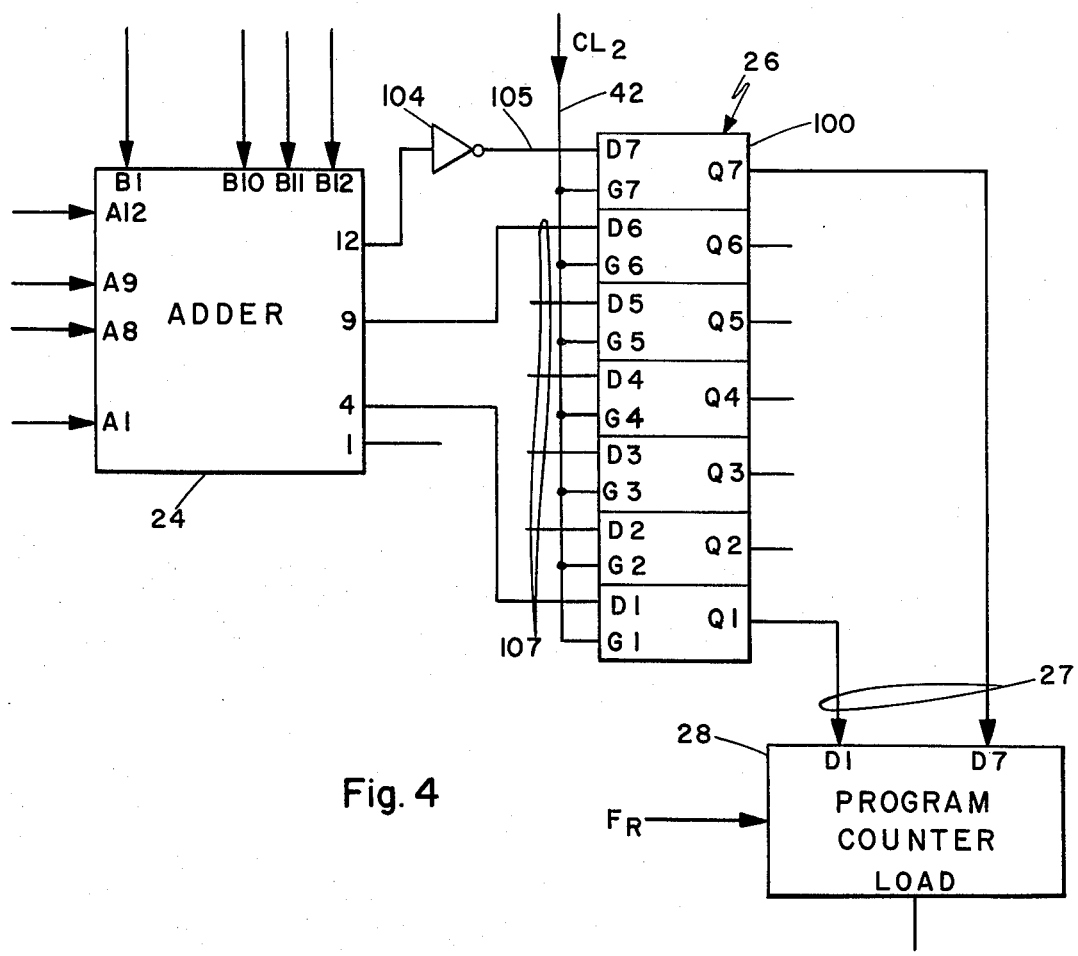
FIG. 4 is a block diagram of the storage latch circuit of FIG. 1.

Referring to FIG. 4, storage latch circuit 26 comprises a plurality of known flip-flop storage elements 100 for storing the digital bits. Inverter circuit 104 in line 105 feeds inverted signals and lines 107 feed non-inverted signals to each of the storage elements 100, that load the digital number in the form of pre-programmed counts into the program counter 28 through lines 27. This converts the 2s-complement binary representation of the adder 24, output 54 to offset binary representation used for the program counter input through lines 27. Adder 24 is a known digital circuit that may comprise three SN54283 circuits made and sold by Texas Instruments, Inc. The plus or minus switch bit, that signifies the condition of the eight bit digital information, provides through storage elements 100 a given pre-programmed count to the counter 28 in which the input digital information is either added or subtracted. For example, if the input digital signal is a corresponding zero number, then the pre-programmed digital count supplied to the program counter 28 is 128. If the ninth bit is 1, then the digital count is a positive number because it is inverted in 2s-complement. This provides a pre-loading of 128 counts plus the counts corresponding to the digital number in lines 54. If the ninth bit is 0, then the digital count is a negative number in inverted 2s-complement and the pre-programmed loading of counter 28 is 128 less the digital count in lines 54.

Figure 5:
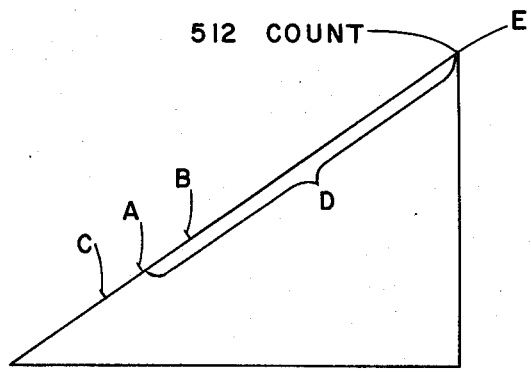
FIG. 5 is a diagrammatic illustration of the count in the program counter of FIG. 1.

It may be understood that the program counter 28 carries a pre-programmed count of a given magnitude to assure that the circuit can handle lag or lead situations. As an example, see FIG. 5, the program counter will have a count capacity of 512. This input count, corresponding to point A is the pre-programmed count of 128. The count D between pre-programmed count A and full count E is for this illustrative embodiment, a count of 384. However, since there is a delay count of 2, caused by the reset and reload delay circuit 32 that will be described in more detail hereinafter, point A is adjusted 2 counts, and D is also adjusted 2 counts, giving D a count of 382. In operation of the circuits, the error signal timing is such that the program counter 28 counts out the D count in the set time interval of each half cycle of the input frequency $Fs$ or 135 Hz. Thus the input timing frequency $Fr$ fed through line 64 is that frequency that will provide a count out of 382 counts in the half cycle of the input signal 84, or in this embodiment a frequency of 103.14 kHz. As described earlier, if the timing pulses $CL_1$ and $CL_2$ lag zero-cross-over of the input signal 84, then the digital number in line 54 is a positive number to the program counter, and would correspond to, for example, point B which means that the pre-programmed count has been increased. This thus reduces the count required to count out the counter and provide a carry pulse, that as will be described hereinafter increases the time of occurrence of timing pulses $CL_1$ and $CL_2$, and thus brings the lag point of the timing pulses closer to the zero-cross-over point. Since this error signal is governed by magnitude, initially the lag lagging timing pulse may be at point 94 and have a magnitude corresponding to line 99 and then decrease down in subsequent cycles to the magnitude of line 98 then down to the magnitude 97 for timing pulse $CL_2$.

Where the digital information to storage lag circuit 26 through lines 54 is minus, then the number to the program counter is reduced by the digital count to a point for example such as point C in FIG. 5. This requires a greater count time for the cycle than the 135 Hz, thus reducing the phase lead condition of timing pulses $CL_1$ and $CL_2$ relative to the input wave form 84.

Figure 2:
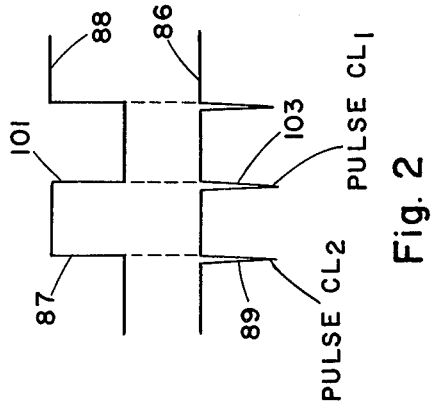
FIG. 2 is a diagram of the pulse timing operation of the output gates of the circuit.

An input frequency signal Fr, that for purposes of this description may be 103.14 kHz, is fed through line 64 to program counter 28 and counts out the remaining counts of the program counter 28. The program counter 28, at full count, supplies an output carry spike pulse to line 67 that over a period of counts forms a negative going spike wave form 86 having a frequency of 270 Hz. The time of occurrence of these output spike pulses, lags or leads the zero crossings of the input wave form 84 by a number that is proportional to the digital number in storage latch 26, that is in turn programmed into the program counter 28. The output wave form 86 is fed through line 66 to a known divider circuit 30 that produces, see FIG. 2, square wave output pulses with a timing coherence of 101 and 103 to form essentially a square wave output 88 having a frequency of approximately 135 Hz. This output is fed through line 74 and line 76 to AND gate 36 and through line 78 and inverter 40 to AND gate 38. The negative going spike wave form 86 is in turn fed through lines 68 and 72, inverter 34 and through lines 80 and 82 to the respective AND gates 36 and 38. Thus an output timing pulse $CL_1$ occurs in line 44 through AND gate 36 when the output through divider circuit 30 and line 74 is simultaneous with a positive going pulse received through inverter 34 and line 80. Referring to FIG. 2, this corresponds with points 101 and 102 in time sequence with the respective wave forms 88 and 86. In turn, an output timing pulse is fed to line 42 through AND gate 38 by square wave signals through line 78 and inverter 40 in coincidence with spike pulses through inverter 34 and line 82 that corresponds with points 87 and 89 of the respective wave form outputs 88 and 86.

Each output carry pulse from program counter 28, corresponding to wave form 86, is fed through line 68 and line 70 to the reset and reload delay circuit 32. This circuit 32 is a known master-slave flip-flop circuit, such as the S5473 circuit made and sold by Signetics. This energizes the delay circuit 32 that provides as output pulse through line 33 that resets the program counter 28. The input frequency signal Fr is fed through line 64 and supplies two counts into the program counter 28 that allows the program counter 28 time to reset and stabilize prior to receiving the next succeeding counts from lines 27. The program counter 28 runs continuously and because of this negative delay, always starts at count 3 as previously described.

In the input signal 84, there may be a velocity error that can result in a phase change due to change in frequency of the input signal. To provide a type II feedback system with critical damping, the output in lines 15 are fed to adder circuit 18. Adder circuit 18 adds the digital information in line 56 with that in line 62 and feeds the sum information to storage latch circuit 22. When storage latch circuit 22 receives a timing pulse $CL_2$ through line 42, it stores the information of adder circuit 18 and holds the information. This digital information is then fed to a known scaling circuit 67 or digital divider 65 and through lines 60 to adder 24 and through lines 58 to storage latch circuit 20. Storage latch circuit 20 is gated to store this information when receiving timing pulse $CL_1$ through line 44. The digital divider 65 feeds a selected one of the significant bits of the digital number to be added to the 9 bit digital information in line 15. For example, the digital divider or scaling circuit 65 may feed the multiplicant of $2^{-6}$ of the digital output of storage latch circuit 22 to the adder circuit 24. In subsequent operations, the digital output of lines 15 at timing pulse $CL_2$ is again added with the digital signal in storage latch 20 in adder circuit 18, which is stored in storage latch circuit 22. It may be observed that this can be a plus or minus signal, depending upon lag or lead signal conditions, and adds information successively regarding phase change to provide a type II damping system. The adder circuit 18 comprises the same known circuit as the adder circuit 24, and the storage latch circuits 20 and 22 comprise the same latch circuits as storage latch circuit 26.

Having described my invention, I now claim:

1. A digital phase locked loop circuit for generating timing pulses synchronized with zero-crossings of a periodic input data signal comprising,
   A to D converter means for continuously quantitizing to digital information the analog magnitude of a periodic input data signal,
   storage means responsive to timing pulses for sampling and storing the digital quantum of said digital information at the time of said timing pulses,
   counter means responsive to a given count respresentative of the stored digital quantum in said storage means for counting the given count in timed synchronism with the zero-crossing of the input signal and providing a carry pulse at the end of the count,
   pulse circuit means for receiving the carry pulse and providing an updated timing pulse output in time synchronism therewith, which timing pulse lags or leads the zero-crossing of the input data signal by the counting time of said counter means in counting said given count,
   and means for feeding said updated timing output pulse to said storage means, whereby the time advance or time delay of the updated timing pulse moves in time the timing output pulse to time synchronism with the zero-crossings of the input data signal.

2. A digital phase locked loop circuit as claimed in claim 1 wherein,
   said counter means includes a counter,
   and said storage means includes circuit means for converting said digital quantum of said digital information into a given count in said counter.

3. A digital phase locked loop circuit as claimed in claim 1 including,
   first means for converting the digital information from said A to D converter means to a 2s-complement binary output having a nine bit digital output where the ninth bit is a 0 or 1 switch bit when the digital output is plus or minus,
   and said storage means including means for converting the 2s-complement binary output of said first means to an offset binary pre-programmed count in the counter.

4. A digital phase locked loop circuit as claimed in claim 3 wherein,
   said storage means includes a plurality of storage elements for storing individual digital bits, and
   an inverter circuit for inverting the switch bits to one of such storage elements and providing a pre-programmed count to the counter means in which the digital information from the first means is added or subtracted.

5. A digital phase locked loop circuit as claimed in claim 4 including,
   clock means for supplying a clock signal to said counter,
   and said pre-programmed count supplied to said counter being counted out at a rate of said clock signal that corresponds in time with the zero corssings of the input data signal.

6. A digital phase locked loop circuit as claimed in claim 1 wherein,
   said timing pulses comprise first and second alternating timing pulses,
   first means including a first storage latch circuit responsive to a first of said timing pulses for storing the quantitized digital information from the A to D converter means at the time of the first timing pulse,
   inverter means for inverting the digital information output of the A to D converter means, and first adder circuit means for adding the output of said first storage latch circuit means and said inverter means providing a 2s-complement binary output to said storage means having a ninth switch bit output that establishes whether the binary output is plus or minus.

7. A digital phase locked loop circuit as claimed in claim 6 wherein,
   said storage means includes a second storage latch circuit responsive to said timing pulse for adding the digital information in said first storage latch circuit with the digital information in said inverter means at the time of said second timing pulse.

8. A digital phase locked loop circuit as claimed in claim 7 wherein,
   said storage means including means for converting said 2s-complement binary output to an offset binary count in said counter means.

9. A digital phase locked loop circuit as claimed in claim 7 including,
   critical damping means including a third storage latch circuit for receiving and storing the digital information in said first adder circuit at the time of said first timing pulse,
   digital divider means for adding a divided portion of the digital information stored in said third storage latch circuit to the information output of said first adder circuit and the time of the second timing pulse,
   and said damping means including additional storage means and adder circuit means for adding said digital information stored in said third storage latch circuit to subsequent stored digital information in said third storage latch circuit received from said first added circuit at the time of said first timing pulse, the total of which is digitally divided and added to the output of said first adder circuit at the time of said second timing pulse.

10. A digital phase locked loop circuit as claimed in claim 5 wherein,
    reset delay means responsive to said clock signals for providing a reset pulse and initial counts to said counter means to allow the counter means to settle before receiving the count from said storage means.

* * * * *